United States Patent [19]

Codama et al.

[11] Patent Number: 5,741,718

[45] Date of Patent: Apr. 21, 1998

[54] METHOD FOR MANUFACTURING A SEMICONDUCTOR DEVICE

[75] Inventors: Mitsufumi Codama; Ichiro Takayama, both of Kanagawa; Michio Arai, Tokyo, all of Japan

[73] Assignees: Semiconductor Energy Laboratory Co., Ltd., Kanagawa; TDK Corporation, Tokyo, both of Japan

[21] Appl. No.: 683,096

[22] Filed: Jul. 16, 1996

Related U.S. Application Data

[62] Division of Ser. No. 385,822, Feb. 9, 1995, Pat. No. 5,604,139.

[30] Foreign Application Priority Data

Feb. 10, 1995 [JP] Japan ................................. 6-37959
Feb. 10, 1995 [JP] Japan ................................. 6-37960

[51] Int. Cl.$^6$ .................................................. H01L 21/86
[52] U.S. Cl. .................. 437/41; 437/21; 437/36; 437/56; 437/229; 430/311
[58] Field of Search ................... 437/41 AS, 40 AS, 437/56, 229, 913, 36, 35, 21; 148/DIG. 150; 430/311

[56] References Cited

U.S. PATENT DOCUMENTS

| | | | |
|---|---|---|---|
| 4,523,368 | 6/1985 | Fiest | 437/36 |
| 4,956,308 | 9/1990 | Griffin et al. | 148/DIG. 106 |
| 4,997,779 | 3/1991 | Kohno | 437/40 AS |
| 5,227,321 | 7/1993 | Lee et al. | 437/29 |
| 5,264,383 | 11/1993 | Young | 437/913 |
| 5,272,100 | 12/1993 | Satoh et al. | 437/36 |
| 5,385,854 | 1/1995 | Batra et al. | 437/913 |
| 5,650,343 | 7/1997 | Luning et al. | 437/36 |

FOREIGN PATENT DOCUMENTS

| | | | |
|---|---|---|---|
| 60-110168 | 6/1985 | Japan | 437/35 |
| 20-38088 | 7/1980 | United Kingdom | 437/36 |

*Primary Examiner*—Michael Trinh
*Attorney, Agent, or Firm*—Sixbey, Friedman, Leedom & Ferguson, P.C.; Gerald J. Ferguson, Jr.

[57] ABSTRACT

In forming a thin film transistor (TFT) having an offset structure or a lightly doped drain (LDD) structure, a blocking material having a lower etching rate than that of a material constructing a gate electrode is formed. By using the blocking material as a mask, a gate electrode material is side-etched selectively to form gate electrodes. The blocking material is processed selectively and remains in a drain region side. Also, an offset region or an LDD region is formed under the blocking material by performing an impurity ion implantation. On the other hand, after the gate electrodes are formed, a resist is added and then light exposure is performed from a source region side using a light blocking material as a mask, so that the resist remains in a drain region side of the gate electrode. Also, by implanting an impurity ion, an offset region or an LDD region is formed in the drain region side.

7 Claims, 11 Drawing Sheets

METHOD FOR MANUFACTURING A SEMICONDUCTOR DEVICE

This is a Divisional application of Ser. No. 08/385,822 filed Feb. 9, 1995 U.S. Pat. No. 5,604,139.

BACKGROUND OF THE INVENTION

1. Field of the Invention

The present invention relates to a semiconductor device such as a thin film transistor (TFT) used in an image sensor, a liquid crystal display device and an integrated circuit and a method for manufacturing the same.

2. Description of the Related Art

Recently, a performance of a large size device is improved by arranging thin film transistors (TFTs) in the device, and products which miniaturization is made by simplifying a peripheral circuit come onto the market. In particular, an active matrix manner in which the TFTs are each arranged to each liquid crystal pixel is applied to a large size liquid crystal display device used in a note book type or lap top type personal computer spread from about 1990, and such liquid crystal display device has superior characteristics as a display device. However, since its manufacturing process is complicated and it is expensive, it is desired to decrease its cost.

Until now, almost every TFTs used in the large size liquid crystal display device are formed by amorphous silicon in a product level. In the amorphous silicon TFT, its performance as a transistor is low. For example, an electron mobility is $10^{-2}$ to $10^{-3}$ times in comparison with that of a single crystalline silicon transistor. Therefore, it is required that a circuit for driving a TFT arranged in a pixel is arranged in an external by using an IC (integrated circuit) formed by signal crystalline silicon.

When a TFT formed by amorphous silicon is arranged in a pixel, It is necessary to set a wide channel width in order to obtain a sufficient driving speed by supplying a large current. However, if a channel width of the TFT arranged in the pixel is extended, an opening (appearance) rate required to obtain high display quality decreases. Since an amorphous silicon film and amorphous silicon nitride film has an electrical instability essentially, reliability for a long period cannot be obtained.

To solve above problem, it is expected that a TFT is formed by poly-crystalline silicon. In such TFT, an ON current value is several ten to one hundred times or more and has high reliability because of stability, in comparison with that of an amorphous silicon TFT. Further, since both of N-type and P-type transistors can be formed, a CMOS circuit can be constructed, so that consumption power can be reduced.

As described above, the poly-crystalline silicon TFT has superior characteristics. However, an OFF current value is large. Also, when a gate voltage is applied to an inverse bias side (negative (minus) side in an N-type TFT, and positive (plus) side in a P-type TFT), a current is increased. Further, when a drain voltage is increased, a drain current is markedly increased.

It is known that increase of a current in the inverse bias side can be prevented by forming an offset structure or an LDD (lightly doped drain) structure in a drain electrode side. In a conventional main method for forming an offset structure, after a gate electrode is patterned, a silicon oxide film is formed by a film formation method having a superior step coverage and then etched by an etching method having high anisotropy, to form a doping mask called a side wall or a spacer in sides of the gate electrode. Since the side wall is formed in both sides of the gate electrode in a conventional method, an offset region and a high resistance region are also formed in a source region side. Therefore, since these regions operate as a serial resistor in a TFT, an ON current reduces. In order not to form an offset region and a high resistance region in a source region side, photolithography process and ion implantation process each can be increased two times. However, by the increase of processes, a cost increases and a yield decreases.

When a MOS transistor which has SOI (Silicon on Insulator) structure and is formed by a single crystalline silicon in which an OFF current does not increase, such as a poly-crystalline silicon TFT, does not include an offset structure and an LDD structure, an phenomenon that a drain current increases rapidly produces easily. If the transistor operates is performed in a bias state that such phenomenon produces, a threshold value may be shifted or an ON current may be decreased.

As described above, a TFT is desired that an OFF current and a current flowing between drain and source electrodes when a gate voltage of an inverse bias is applied is small, an ON current is sufficiently large, a drain current does not increase rapidly and reliability is high.

In order to obtain such TFT, it is desired that an offset structure or an LDD structure is formed in only drain region side. However, in a conventional method, since such TFT cannot be formed without largely increasing the number of processes, it is disadvantageous in a yield and a cost.

SUMMARY OF THE INVENTION

An object of the present invention is to minimize the number of processes, improve a yield without deteriorating an electric characteristic of a TFT, and obtain a TFT having high reliability.

In order to solve the above problems, a method for forming an offset structure or an LDD structure in only drain electrode (region) side in a self-alignment while minimizing the number of processes is described below.

After a film having a low resistance is formed as a gate electrode, a film (blocking material or shielding material) which is not etched easily by an etching material of the gate electrode is formed. It is required that the blocking material is a material which is not etched easily in comparison with a material (gate electrode material) constructing the gate electrode in a desired etching, that is, a material which an etching selection ratio to the gate electrode material can be obtained. That is, an etching rate of the blocking material is smaller than that of the gate electrode material. For example, a material etched by a desired etchant can be used as a gate electrode and a material which is not etched by the desired etchant can be used as the blocking material. When aluminum is used as a gate electrode material, chromium can be used as the blocking material. This is because the chromium is not almost etched by an etchant for etching the aluminum. When silicon having one conductivity type is used as the gate electrode material, a silicon oxide can be used as the blocking material. This is because an etching rate of the silicon oxide in dry etching is extremely smaller than that of the silicon having one conductivity type.

By photolithography, the blocking material is formed to a gate electrode pattern. After removing the blocking material by etching, the gate electrode material is etched. If isotropic etching is performed, the gate electrode material can be side-etched selectively. As an etching result, a structure that the blocking material overhangs the gate electrode material is obtained.

An overhanging portion of the blocking material in a source region side is removed by photolithography, so that the source region side is exposed and the overhanging portion of the blocking material remains in only drain region side. In this state, an offset structure can be obtained by doping with an impurity for providing one conductivity type in an ion implantation. That is, since a portion under the gate electrode and an overhung portion (portion just under the overhanging portion of the blocking material) is not doped, the overhung portion can be formed as an offset region.

By setting a suitable thickness of the blocking material and a suitable doping condition, an impurity which provides one conductivity type and has a low concentration than source and drain regions can be doped into the overhung portion (portion just under the overhanging portion of the blocking material), so that a lightly doped region can be formed. That is, a lightly doped drain (LDD) structure can be obtained.

For example, by performing an impurity implantation through the blocking material which remains in a drain region side, a portion just under the blocking material can be doped at a concentration of $1\times10^{15}$ to $1\times10^{18}$ atoms/cm$^3$, and another portion such as a contact portion can be doped at a concentration of $1\times10^{19}$ to $1\times10^{21}$ atoms/cm$^3$.

An impurity implantation process can be performed two times. That is, source and drain regions are formed in a first implantation and then an LDD region is formed between a drain region and a channel forming region in a second implantation.

The above impurity implantations may be performed as follows. That is, The first impurity implantation is performed in a condition that an impurity is not implanted into a region masked by the blocking material, and then the blocking material is removed. Such condition is obtained by controlling, for example, an accelerating voltage. After that, the second impurity implantation is performed to lightly dope a region (an overhung portion) masked by the blocking material.

In another manner, a first impurity implantation is performed in a condition that an impurity is not implanted into a region masked by the blocking material. Such condition is obtained by controlling, for example, an accelerating voltage. After that, a second impurity implantation is performed by supplying to an ion a larger energy than that in the first impurity implantation, that is, by increasing an accelerating voltage, so that an impurity can be doped just under the blocking material.

In all manner, by doping a region masked by the overhanging portion of the blocking material, with impurity ions (for example, phosphorus and boron) at a low concentration than that of another exposed region, the masked region can be formed as a lightly doped region.

By forming on a gate electrode the blocking material which overhangs in only drain region side, an offset structure or an LDD structure can be formed in only drain region side in a self-alignment. Also, since such structure can be formed by a simple process, a yield can be improved and a cost can be decreased.

Also, in order to solve the above problems, another method for forming an offset structure or an LDD structure in only drain electrode side (drain region side) in a self-alignment while minimizing the number of processes is described below.

After a film having a low resistance is formed as a gate electrode, a film having a light blocking characteristic or a film having a smaller refractive index than that of a resist is formed as a light blocking material, and then a gate electrode pattern is formed by photolithography. A gate electrode material is etched after the light blocking material is removed by etching. If the gate electrode material is side-etched, the light blocking material overhangs a gate electrode to be formed by this etching. It is necessary to use, as the light blocking material, a material which is not etched easily by an etchant used to etch the gate electrode material, or a material having a smaller etching rate than that of the gate electrode material in comparison with the gate electrode material in a desired etching method. When silicon is used as the gate electrode material, a silicon oxide can be used as the light blocking material. Also, when aluminum is used as the gate electrode material, chromium can be used as the light blocking material.

After a resist is removed, a positive type resist is added (formed) again. If an oblique light exposure from a source region side is performed, since an overhanging portion in a drain region side operates as a blocking portion, the positive type resist is not exposed by light, so that the resist remains in only the drain region side at development. Since this resist is positioned adjacent to a gate electrode, an active layer just under the resist can be formed as a non-doped region or a lightly doped region by perform an ion implantation using the resist as a mask.

An offset structure can be obtained by doping using the resist as a mask. Also, an LDD structure can be obtained by doping again with an impurity at a suitable accelerating voltage and a suitable dose after the resist (mask) is removed. By doping after a gate silicon oxide film is etched using an etching solution containing mainly hydrogen fluoride so as to remain a resist (mask) portion and obtain the film at a desired thickness, a lot of doping conditions can be set.

Also, by doping with an impurity after a gate silicon oxide film is etched so as to remain a portion just under the resist (mask) portion and obtain the film at a half of an original thickness or less and then the resist portion is removed, an LDD structure can be obtained without doping with the same impurity twice. Second doping may be performed so that an impurity concentration in the lightly doped region is $1\times10^{15}$ to $1\times10^{18}$ atoms/cm$^3$.

By forming an overhanging light blocking material on a gate electrode and performing an oblique light exposure using the light blocking material, a resist (mask) can remain in a portion which the light blocking material operates as a blocking portion. Therefore, by forming the remaining resist (mask) in a drain region side, a non-doped offset region and a lightly doped LDD region can be formed between a drain region and a channel forming region in a self-alignment.

BRIEF DESCRIPTION OF THE DRAWINGS

FIGS. 1A to 3C show a manufacturing process of a thin film transistor by an embodiment of the present invention;

FIGS. 5A to 7E show a manufacturing process of a thin film transistor by another embodiment of the present invention;

FIGS. 8A to 9E show a manufacturing process of a thin film transistor by another embodiment of the present invention;

DETAILED DESCRIPTION OF THE PREFERRED EMBODIMENTS

[Embodiment 1]

FIGS. 1A to 3C show a manufacturing process of a thin film transistor by an embodiment of the present invention. The embodiment relates to a structure in which an offset region is formed between a drain region and a channel forming region.

Figure 1A:
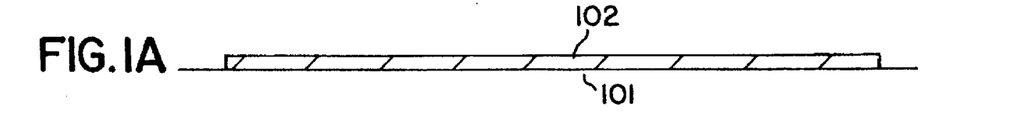

An amorphous silicon 102 is formed on a glass substrate 101 coated by a protective film (not shown) by, for example, a low pressure CVD (LPCVD). The amorphous silicon is solid-phase-grown at about 500 to 850° C. to crystallize it. (FIG. 1A)

A temperature of solid phase growth depends on a heat resistance of a glass substrate. In a glass containing no alkali, its limit temperature is about 600° C. However, a crystalline glass can be used at 850° C. or more. Also, in stead of the solid phase growth, crystallization by irradiating laser light or intense light can be performed. A method for obtaining a crystalline silicon film at a film formation can be used.

Figure 1B:
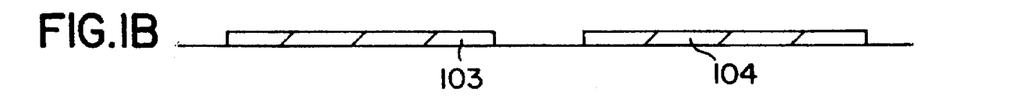
Figure 1C:
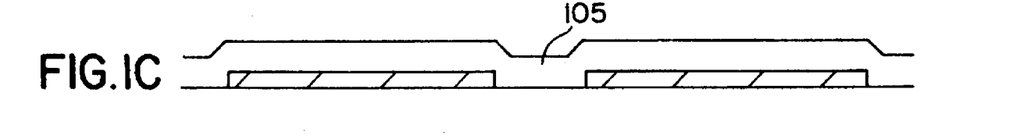

A solid-phase-grown crystalline silicon film is patterned to form active layers 103 and 104 as shown in FIG. 1B. Further, a silicon oxide film 105 is formed at a thickness of 1000 Å by a plasma CVD. (FIG. 1C)

Figure 1D:
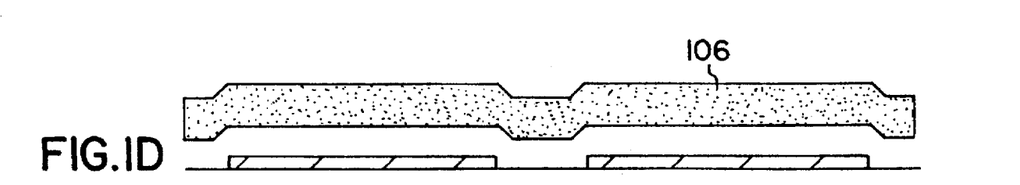
Figure 1E:
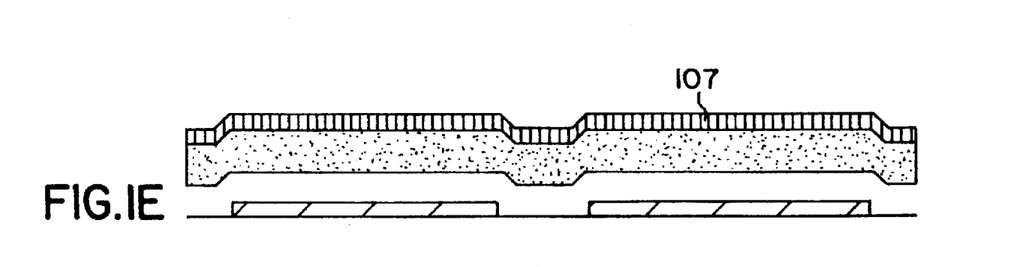

After that, an $n^+$ poly-crystalline silicon film 106 as a gate electrode is formed at a thickness of 2500 Å by a plasma CVD (FIG. 1D). Further, a silicon oxide ($SiO_2$) film 107 is formed as a blocking material at a thickness of 2000 Å (FIG. 1E).

Figure 1F:
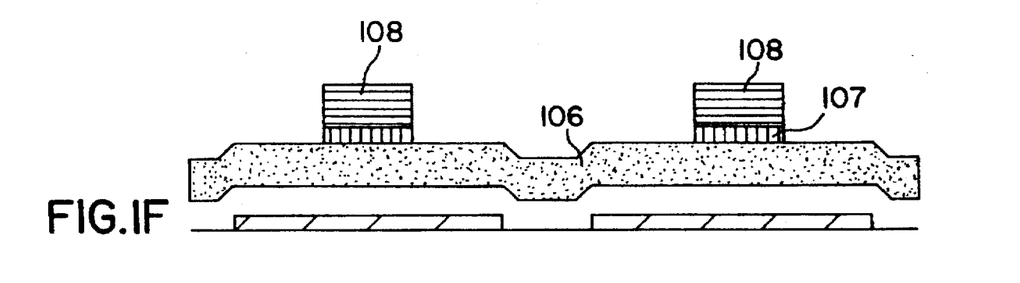
Figure 1G:
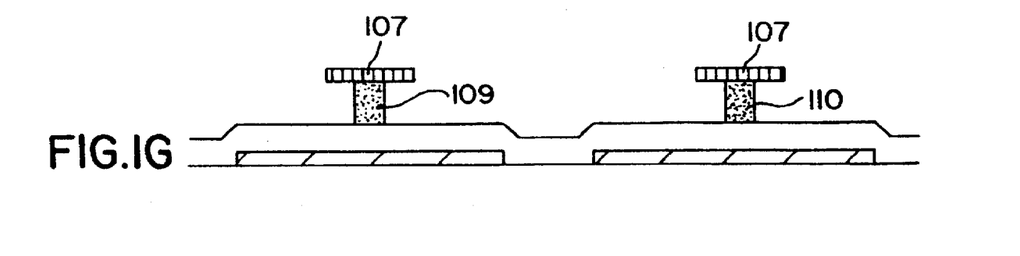

FIG. 1F shows a result that the blocking material is etched by an etching solution of hydrofluoric acid series. In FIG. 1F, using a resist mask 108, a gate electrode is patterned by photolithography. Further, the $n^+$ poly-crystalline silicon film 106 is etched by dry etching. when the film 106 isotropic etched for a desired time, as shown in FIG. 1G, the blocking material 107 overhangs gate electrodes 109 and 110 formed by this etching.

In accordance with a length of an overhanging portion of the blocking material, an offset length or an LDD length can be adjusted. The length of the overhanging portion of the blocking material can be adjusted by an etching condition of the $n^+$ poly-crystalline silicon film 106. In the embodiment, the length of the overhanging portion of the blocking material is set to 500 nm, so that the offset length is about 500 nm. The length of the overhanging portion of the blocking material can be set to a desired length.

Figure 2A:
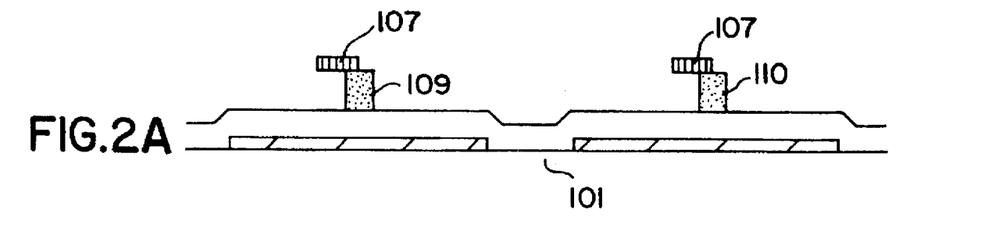

As shown in FIG. 2A, using photolithography, the overhanging portion of the blocking material in a source region side is removed by etching. In FIGS. 2A to 2E, drain regions are formed in left sides of the gate electrodes 109 and 110. Further, a region masked by the blocking material 107 is formed between a drain region and a channel forming region formed under a gate electrode.

Figure 2B:
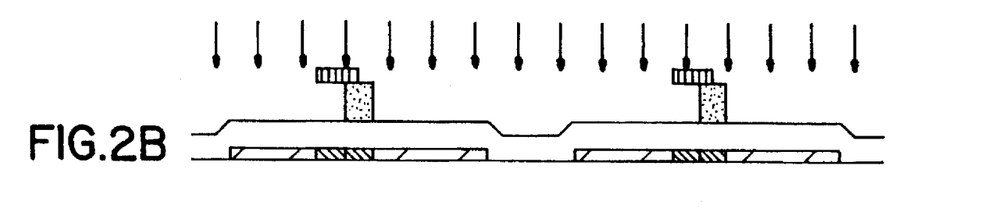

As shown in FIG. 2B, phosphorus is ion-implanted at a dose of $1\times10^{15}$ atoms/cm$^2$. In this process, a phosphorus ion is not implanted in a portion which is masked by the blocking material 107 and the gate electrodes 109 and 110, so that the phosphorus ion is implanted in another region.

Figure 2C:
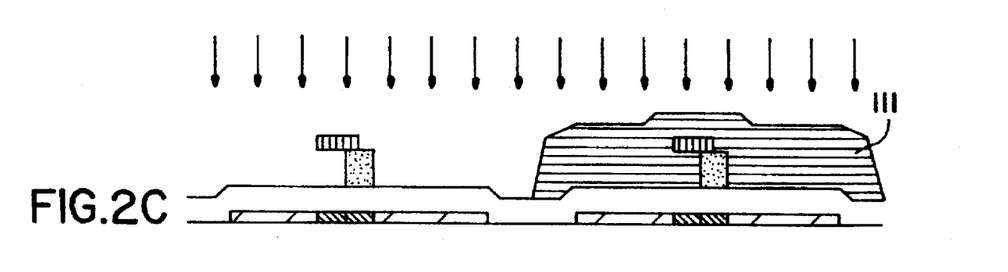

As shown in FIG. 2C, a region other than a portion in which P-type is desired is covered by the resist 111, and then boron is ion-implanted at a dose of $5\times10^{15}$ atoms/cm$^2$.

Figure 2D:
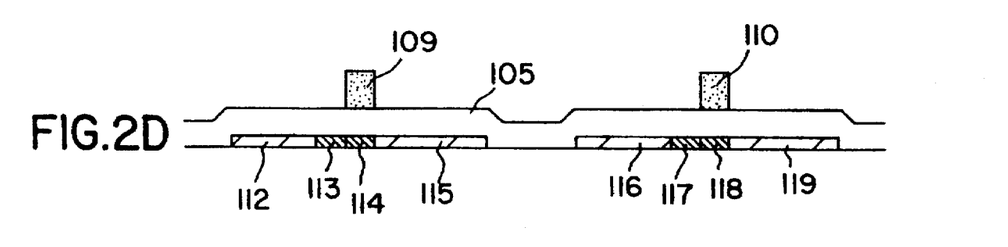

The resist 111 is removed by ashing, to obtain a state as shown in FIG. 2D. Further, impurities doped into source and drain regions of each TFT are activated for 12 hours at 500° C.

As a result, a P-channel type TFT which has a drain region 112, an offset region 113, a channel forming region 114, a source region 115 and the gate electrode 109 and an N-channel type TFT which has a drain region 116, an offset region 117, a channel forming region 118, a source region 119 and the gate electrode 110 are formed. Also, the silicon oxide film 105 is used as a gate insulating film.

Figure 2E:
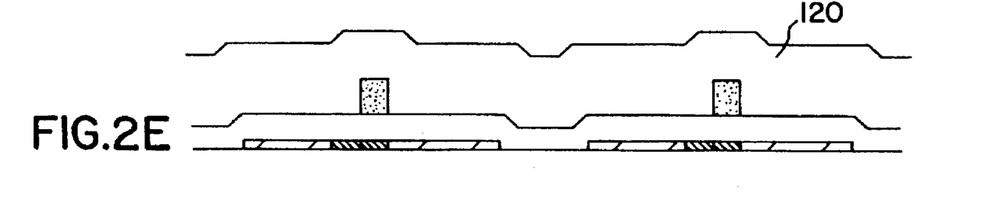
Figure 3A:
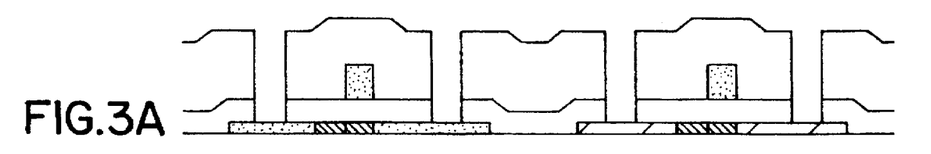
Figure 3B:
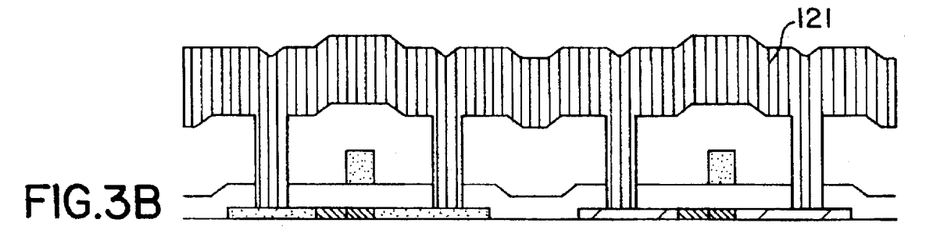
Figure 3C:
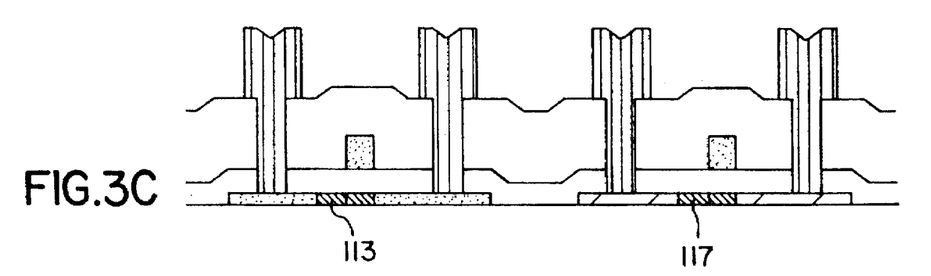

As shown in FIG. 2E, a phosphorus glass 120 is formed as an interlayer insulating film by an atmosphere pressure CVD, so that contact holes are formed as shown in FIG. 3A. Further, as shown in FIG. 3B, an aluminum film 121 is formed as an electrode by sputtering, and then patterned as shown in FIG. 3C, to form a P-channel TFT in a left side and an N-channel TFT in a right side.

In TFT forming processes described above, the offset region 113 of the P-channel type TFT and the offset region 117 of the N-channel type TFT can be formed in a self-alignment. Also, by timely setting a condition of a process (as shown in FIG. 1G) for side-etching a gate electrode, a length of the offset region can be adjusted and TFT characteristics can be controlled easily. Further, since reproducibility is high, the above process is very useful in quality maintenance and a yield. Furthermore, since the above precess can be performed by a simple process, a TFT can be obtained with a low cost and it is very useful in an industry.

Figure 4A:
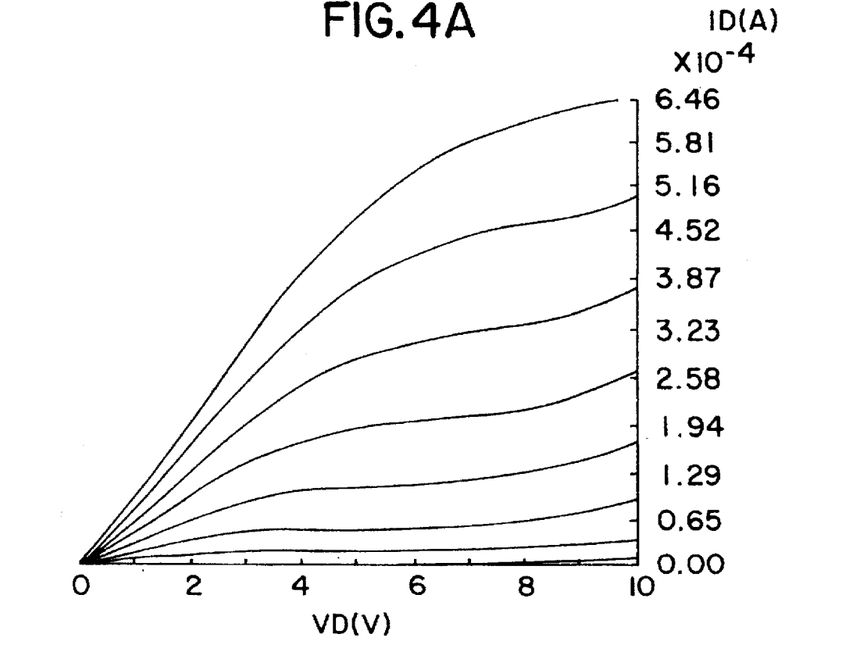
FIGS. 4A and 4B show electrical characteristics of TFTs.
Figure 4B:
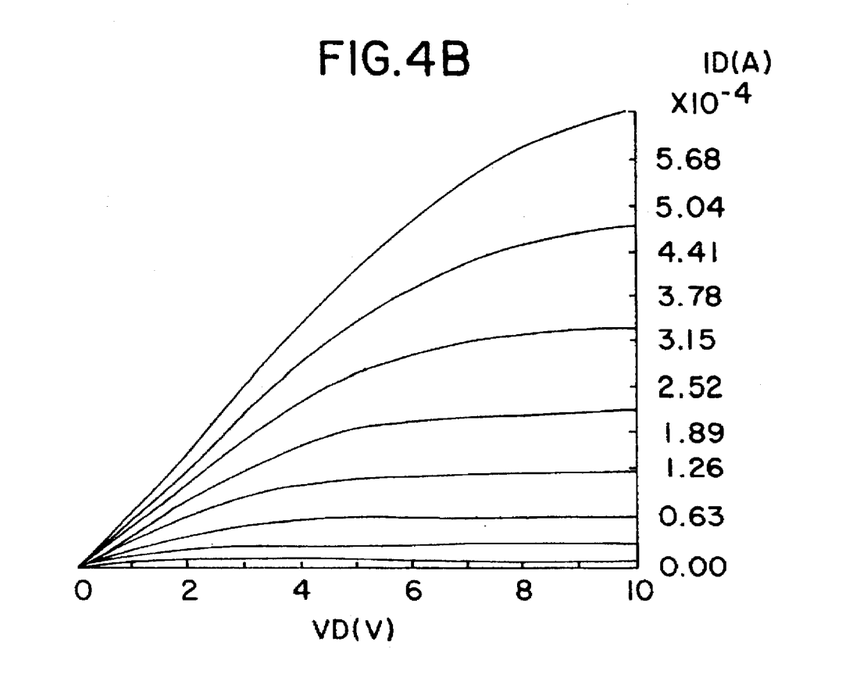

FIG. 4A shows an electrical characteristic of a TFT having a conventional structure. FIG. 4B shows an electrical characteristic of a TFT (N-channel type TFT in right side) in the embodiment of the present invention. In FIGS. 4A and 4B, VD represents a drain voltage and ID represents a drain current. A TFT having an electrical characteristic as shown in FIG. 4A is formed without using the blocking material in the process of FIG. 1E. A difference between The TFT of the present invention and the conventional TFT is that whether the offset region 117 is formed or not.

As can be seen from FIG. 4A, in the conventional TFT, a down portion appears in a range which the VD is high. On the other hand, in the TFT of the present invention, such down portion does not appear as shown in FIG. 4B. A TFT having a characteristic as shown in FIG. 4B is a transistor which a circuit design is easy in utilizing this TFT to an analog circuit and prefers extremely.

[Embodiment 2]

In Embodiment 1, an offset region is formed by blocking an impurity ion to be implanted, using the blocking material 107. In the present embodiment, by using the blocking material 107 in the processes of Embodiment 1, a region masked by the blocking material is lightly doped.

In order to realize the present embodiment, by increasing an accelerating voltage in a process as shown in FIG. 2B, a phosphorus ion may be implanted into regions (regions 113 and 117 as shown in FIG. 2D) masked by the blocking material 107 at a dose of $1\times10^{12}$ atoms/cm$^2$ and a boron ion may be implanted into the regions at a dose of $5\times10^{12}$ atoms/cm$^2$. That is, the implanted ions penetrate the blocking material to a certain extent, so that the regions 113 and 117 may be lightly doped.

In the present embodiment, by blocking a part of ions to be implanted using the blocking material 107 at doping and by penetrating another part of ions, a lightly doped region (LDD) is formed in comparison with exposed regions (source and drain regions).

A doping condition is not limited to the above condition, and can be determined timely in a range that an impurity ion implanted into a lightly doped drain region has a concentration of $1\times10^{15}$ to $1\times10^{18}$ atoms/cm$^3$. This concentration may be set in accordance with a necessary TFT characteristic and an apparatus (device) to be used.

In the present embodiment, although an LDD structure is obtained by adjusting an ion implantation condition, the same effect can be obtained by thinning a thickness of the blocking material 107 in a condition of Embodiment 1. That is, by thinning a thickness of the blocking material 107, a part of ions to be implanted penetrate, so that the lightly doped region 113 or 117 can be formed.

[Embodiment 3]

In the present embodiment, the blocking material 107 is removed after the process as shown in FIG. 2B is performed, and then phosphorus ion implantation is performed, so that the regions 113 and 117 are formed as a lightly doped region. Since two TFTs in left and right sides become an N-channel type TFT, the process of FIG. 2C is not performed. By the present embodiment, a TFT having an LDD structure can be formed.

[Embodiment 4]

In the present embodiment, after the process as shown in FIG. 2B, a second phosphorus ion implantation is performed by further high accelerating voltage, so that the regions 113 and 117 are formed as a lightly doped region. Since ions penetrate the blocking material 107 and are then implanted into the regions 113 and 117, an accelerating voltage is increased. By the present invention, a TFT having an LDD structure can be formed.

By the present invention, a MOS transistor having an offset structure or an LDD structure can be manufactured easily without changing the number of processes largely.

[Embodiment 5]

Figure 5A:
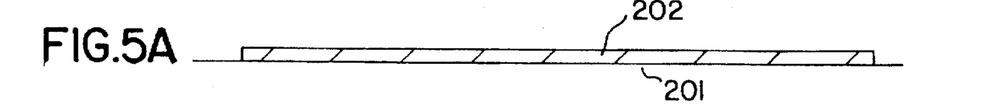

FIGS. 5A to 7E show a manufacturing process of a thin film transistor by another embodiment of the present invention. An amorphous silicon 202 having a thickness of 1000 Å is formed on a glass substrate 201 coated by a protective film (not shown) by, for example, a LPCVD and a plasma CVD. The amorphous silicon 202 is solid-phase-grown at about 500° to 850° C. to poly-crystallize it. A temperature of solid phase growth depends on a heat resistance of a glass substrate. In a glass containing no alkali, its limit temperature is about 600° C. However, a crystalline glass can be used at 850° C. or more. This crystallization process may be performed by irradiating laser light or intense light or by a method for directly forming a crystalline silicon film at a film formation. (FIG. 5A)

Figure 5B:
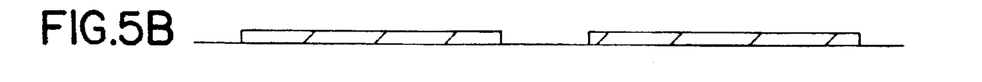
Figure 5C:
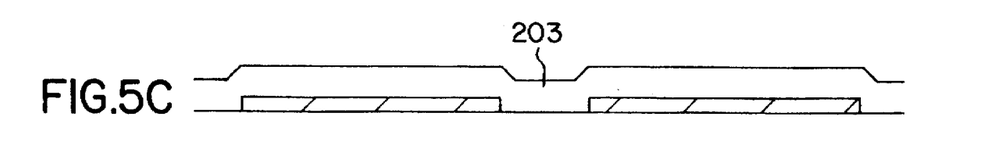
Figure 5D:
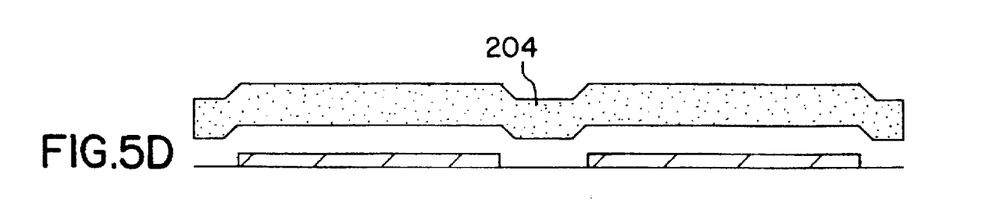
Figure 5E:
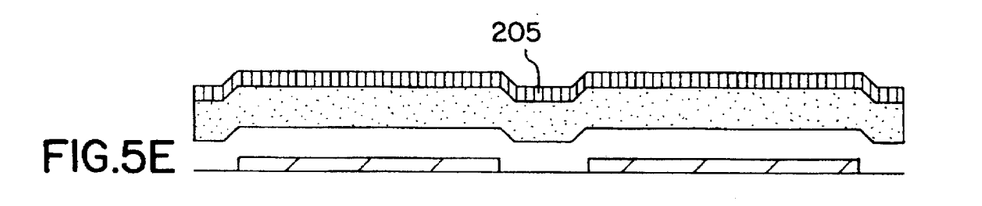

The solid-phase-grown silicon film is patterned as shown in FIG. 5B, and then a silicon oxide film 203 as a gate insulating film is formed at a thickness of 1000 Å by a plasma CVD as shown in FIG. 5C. Also, an n$^+$ poly-crystalline silicon film 204 as a gate electrode is formed at a thickness of 2500 Å by an LPCVD as shown in FIG. 5D. Further, for example, aluminum (Al) is formed as a light blocking material 205 at a thickness of 2000 Å. (FIG. 5E)

Figure 5F:
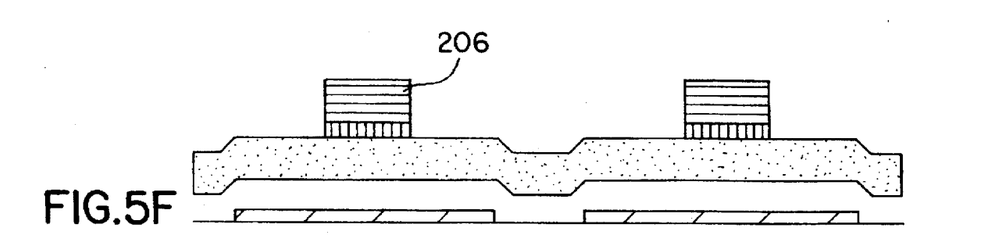
Figure 5G:
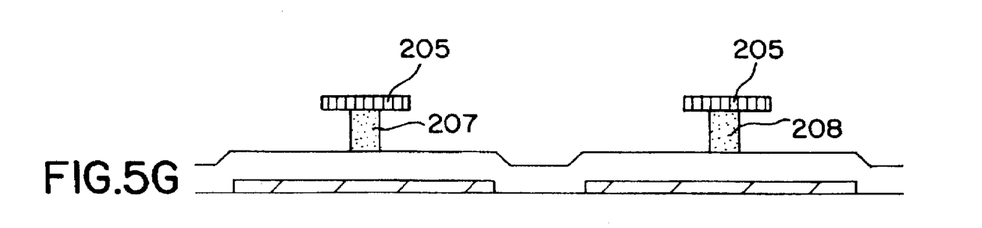

The gate electrode is patterned by photolithography using a resist mask 206. FIG. 5F shows a result that the light blocking material 205 is etched by an etching solution of phosphoric acid series. Further, the n$^+$ poly-crystalline silicon film 204 is etched by dry etching. By isotropic etching the film 204 for a desired time, as shown in FIG. 5G, the light blocking material 205 overhangs.

In accordance with a length of an overhanging portion of the light blocking material, an offset length or an LDD length can be adjusted. In the embodiment, the length of the overhanging portion of the light blocking material is set to 500 nm. As a result, two gate electrodes 207 and 208 are formed.

Figure 6A:
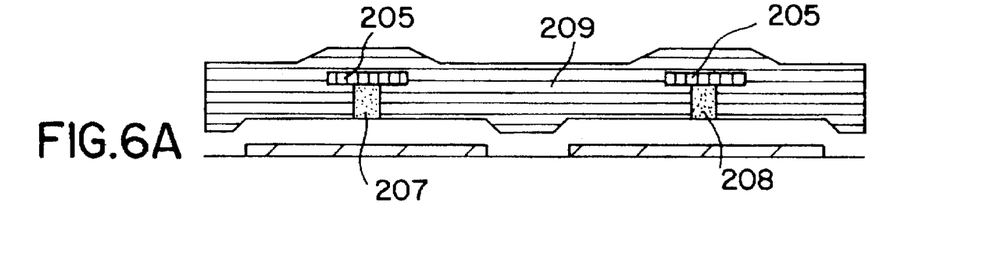
Figure 6B:
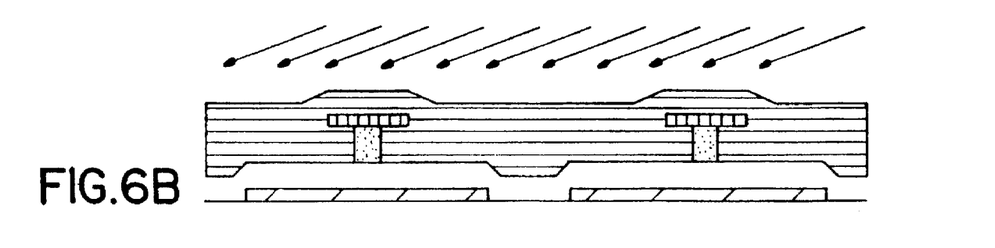

As shown in FIG. 6A, a resist 209 is added (formed). Also, as shown in FIG. 6B, an exposure is performed by irradiating light from a source electrode side of a MOS transistor, for example, at an angle of 75° to a straight line vertical to a substrate.

Figure 6C:
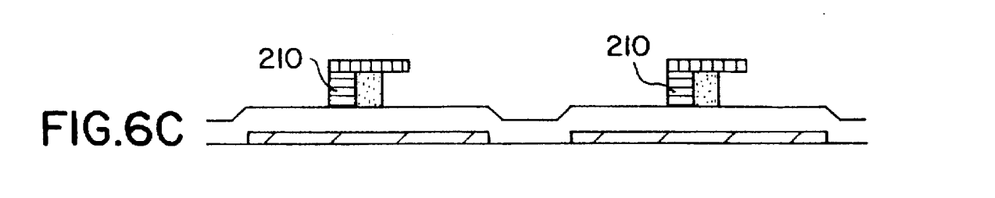
Figure 11:
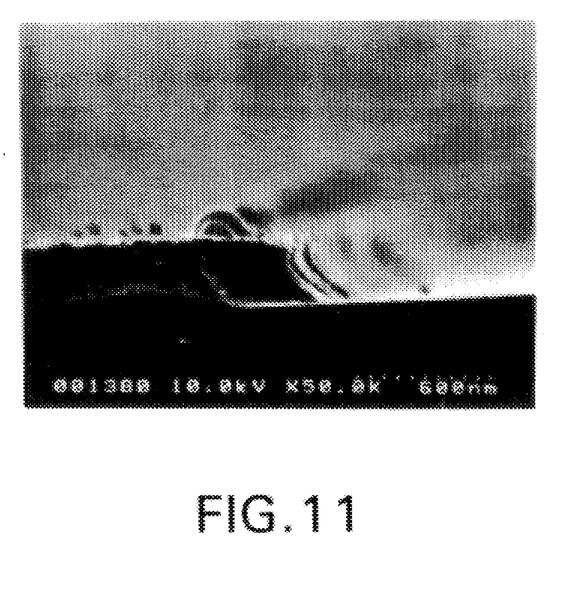
FIG. 11 shows a photograph representing a fine pattern formed on a gate insulating film in the present invention.

When a development is performed, since the light is blocked by the light blocking material 205 and the gate electrodes 207 and 208, the resist 210 remains in only one side, as shown in FIG. 6C. By baking the resist 210 at 150° C., the resist 210 is not developed in a photolithography process performed later. FIG. 11 is a photograph representing a fine pattern formed on a gate insulating film as an object (substrate). This photograph represents a portion of the gate electrode 207 or 208. As can be represented from the photograph of FIG. 11, a resist (corresponding to the resist 210) having a length of about 500 to 550 nm (5000 to 5500 Å) remains in a side of a left gate electrode. Accordingly, by performing an ion implantation using the resist 210 which remains adjacent to the gate electrodes 207 and 208 as a mask, a non-doped region can be formed just under the resist 210.

Figure 6D:
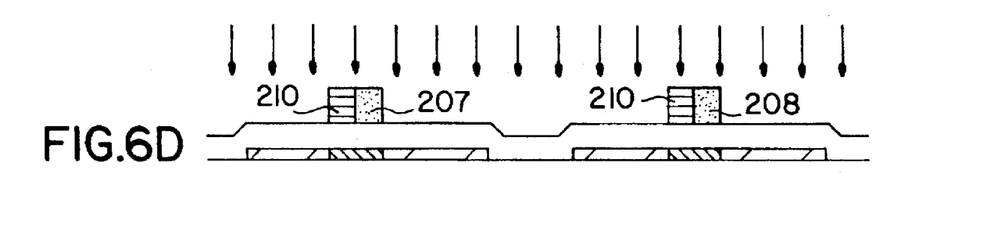
Figure 6E:
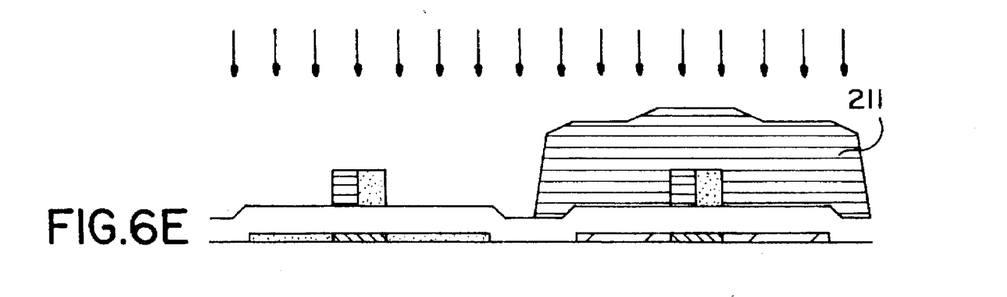

As shown in FIG. 6D, after removing the light blocking material 210, an phosphorus ion is implanted at a dose of $1\times10^{15}$ atoms/cm$^2$. Also, as shown in FIG. 6E, a region other than a portion in which a P-type is desired is covered by the resist 211, and then boron is ion-implanted at a dose of $5\times10^{15}$ atoms/cm$^2$. Further, after the resist 211 is removed by ashing, activation is performed for 12 hours at 500° C.

Figure 7A:
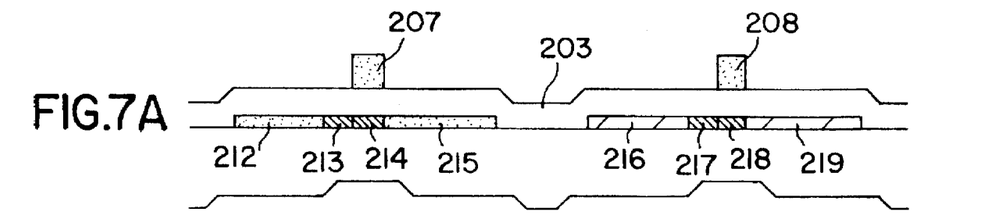

As a result, a P-channel type TFT which has a drain region 212, a non-doped offset region 213, a channel forming region 214, a source region 215, the gate electrode 207 and the gate insulating film 203 and an N-channel type TFT which has a drain region 216, a non-doped offset region 217, a channel forming region 218, a source region 219, the gate electrode 208 and the gate insulating film 203 are formed. (FIG. 7A)

Since the offset regions 213 and 217 are masked by the resist 210, these regions each are a non-doped region. If phosphorus is further implanted at a dose of about $1\times10^{12}$ atoms/cm$^2$ in a state as shown in FIG. 7A, the regions 213 and 217 can be formed as a lightly doped region, so that an LDD structure can be obtained. However, since a process as shown in FIG. 6E is not performed, two TFTs each become an N-channel type.

Figure 7B:
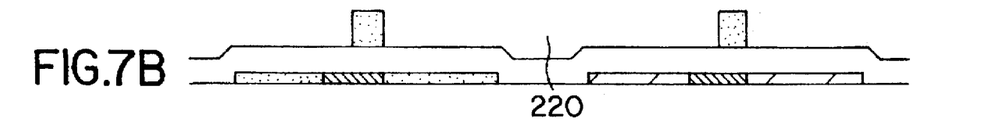
Figure 7C:
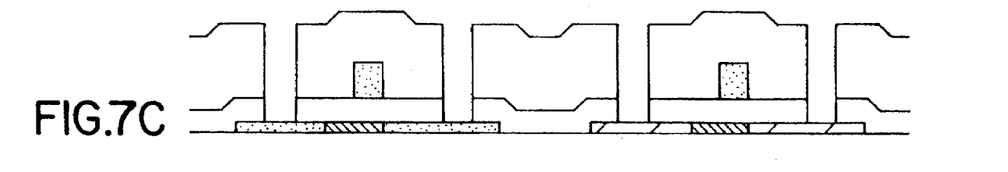
Figure 7D:
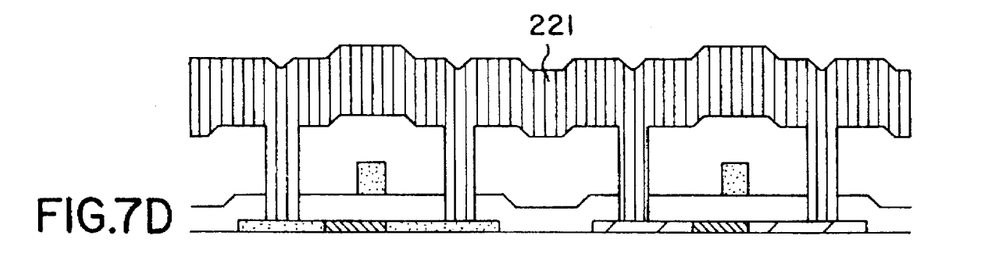
Figure 7E:
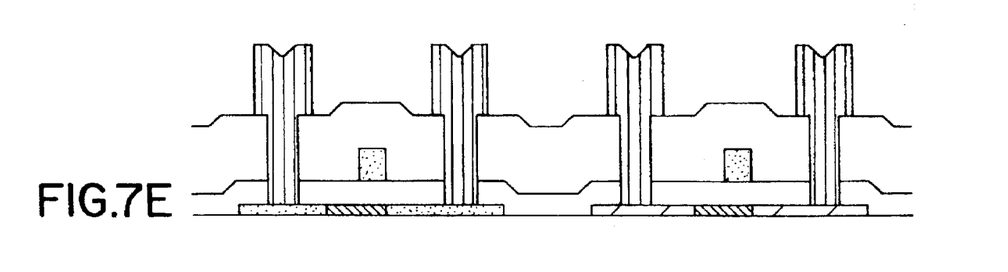

As shown in FIG. 7B, a phosphorus glass 220 is formed as an interlayer insulating film by an atmosphere pressure CVD, and then contact holes are formed as shown in FIG. 7C. Further, after aluminum. 221 is formed as an electrode by a sputtering, patterning is performed, so that a circuit is constructed.

Figure 10:
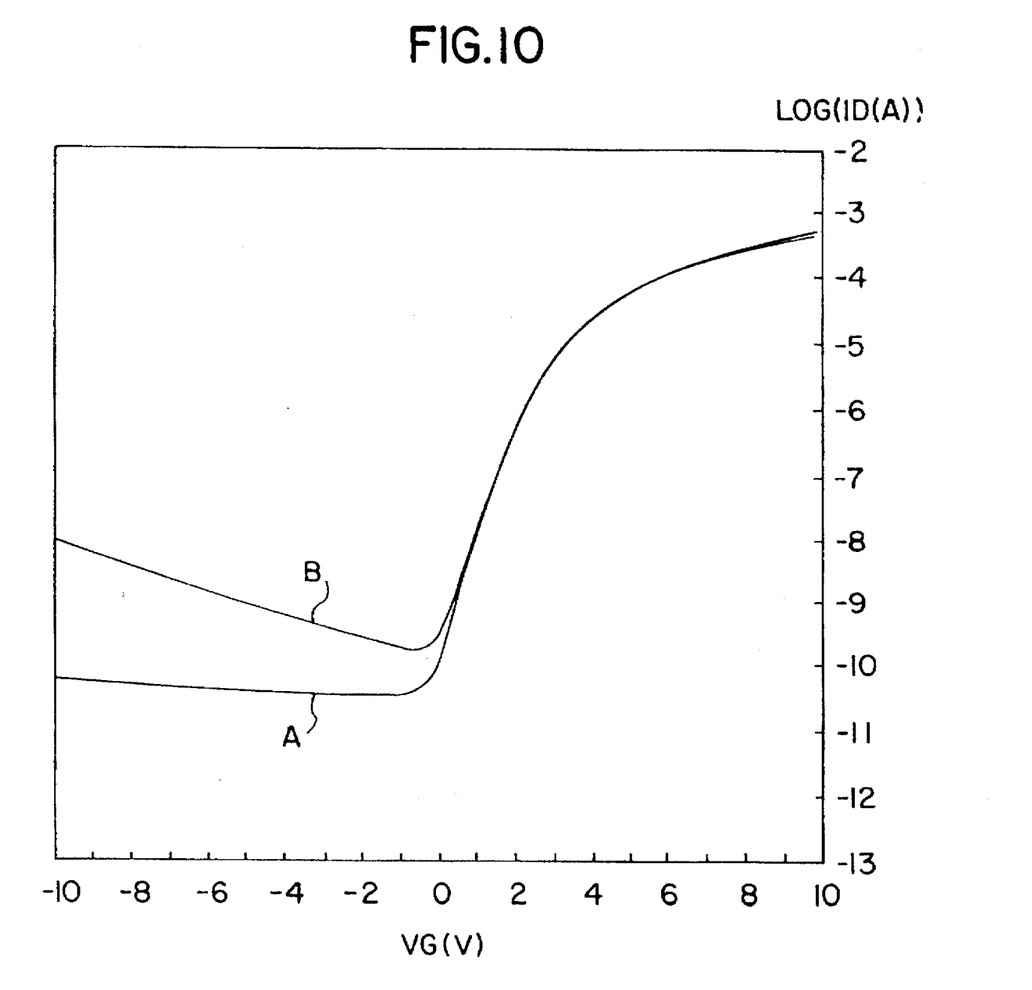
FIG. 10 shows an electric characteristic of an N-type TFT according to the present invention and an electric characteristic of a conventional TFT having an offset structure.

In FIG. 10, a symbol A represents an electric characteristic (VG-ID) of the N-type TFT formed by the above processes and a symbol B represents an electric characteristic of a conventional TFT which does not include an offset structure. As can be seen from FIG. 10, although an ON current is not almost changed, an OFF current is decreased with 2 figures in maximum in comparison with that of the conventional TFT.

[Embodiment 6]

FIGS. 8A to 9E show a manufacturing process of a thin film transistor by another embodiment of the present invention. In the present invention, after the processes as shown in FIG. 5A to 5G and FIGS. 6A to 6C are performed, the processes as shown in FIGS. 8A to 9E are formed.

Figures 8A, 8B:
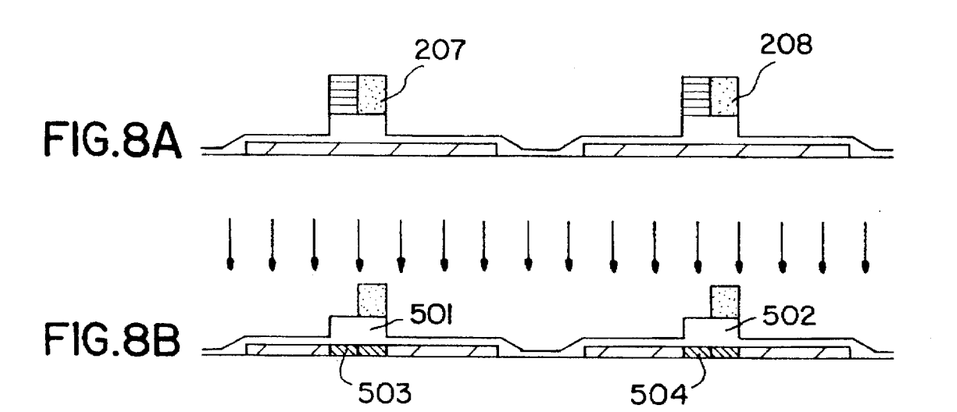

As shown in FIG. 8A, the light blocking material 205 is removed, and then a part of the gate silicon oxide film 203 is wet-etched using the gate electrodes 207 and 208 and the resist (mask) 210 as masks.

As a result, thick gate silicon oxide films 501 and 502 can remains in a drain region side. Further, the resist 210 is removed and then an impurity ion implantation is performed using a suitable voltage and a suitable dose, so that regions 503 and 504 (which the gate silicon oxide films 501 and 502 remain thick) has a low impurity concentration and the other regions (which the gate silicon oxide films remain thin or are removed) has a high impurity concentration. That is, an LDD structure can be formed easily. The regions 503 and 504 can be formed as a non-doped region, that is, an offset region.

Figure 8C:
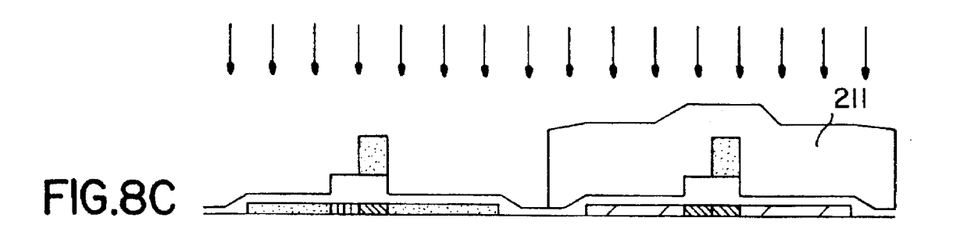

As shown in FIG. 8B, phosphorus is ion-implanted at a dose of $1\times10^5$ atoms/cm$^2$. Also, as shown in FIG. 8C, a region other than a portion in which a P-type is desired is covered by the resist 211, and then boron is ion-implanted at a dose of $5\times10^{15}$ atoms/cm$^2$. Further, after the resist 211 is removed by ashing, activation is performed for 12 hours at 500° C.

As a result, a P-channel type TFT which has the drain region 212, the LDD region 503, the channel forming region 214, the source region 215, the gate electrode 207 and the gate insulating film 203 and an N-channel type TFT which has the drain region 216, The LDD region 504, the channel forming region 218, the source region 219, the gate electrode 208 and the gate insulating film 203 are formed. (FIG. 9A)

In the TFTs, the LDD regions 503 and 504 which can be formed as a non-doped region are adjacent to the channel forming regions 214 and 218, respectively, and each are formed between the channel forming region and the drain region.

Figure 9A:
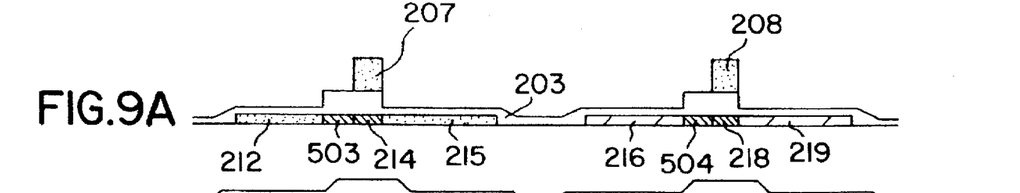

The feature of the structure as shown in FIG. 9A is that a portion of the gate insulating film 203 which contacts with upper surfaces of the regions 503 and 504 and the channel forming regions 214 and 218 is thicker than another portion of the gate insulating film 203 which contacts with upper surfaces of the drain regions 212 and 216 and the source regions 215 and 219. The gate insulating film 203 also operates as a barrier used to form a lightly doped region and a non-doped region.

Figure 9B:
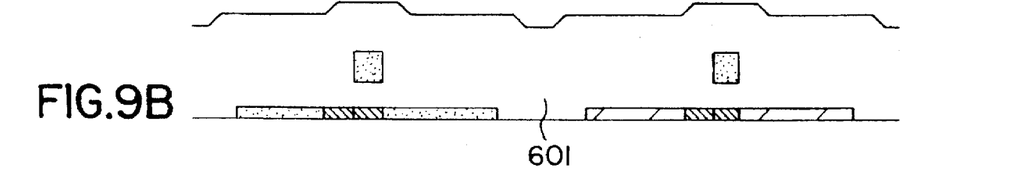
Figure 9C:
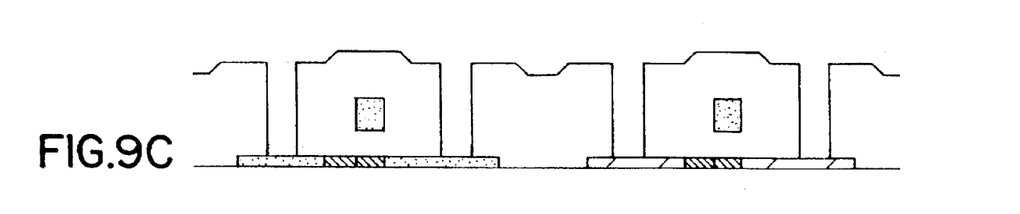
Figure 9D:
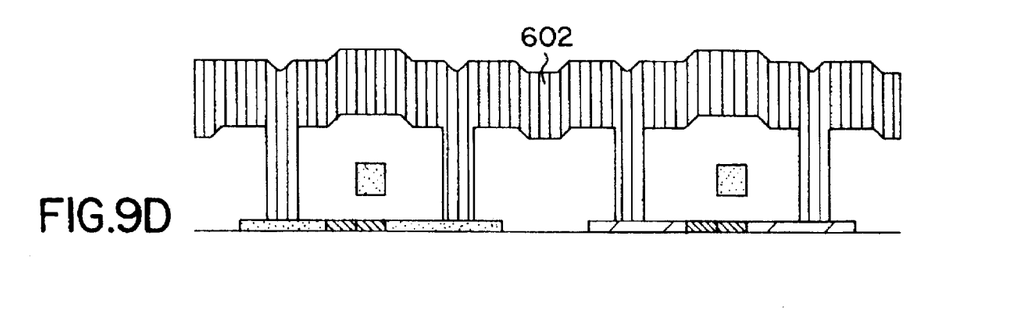
Figure 9E:
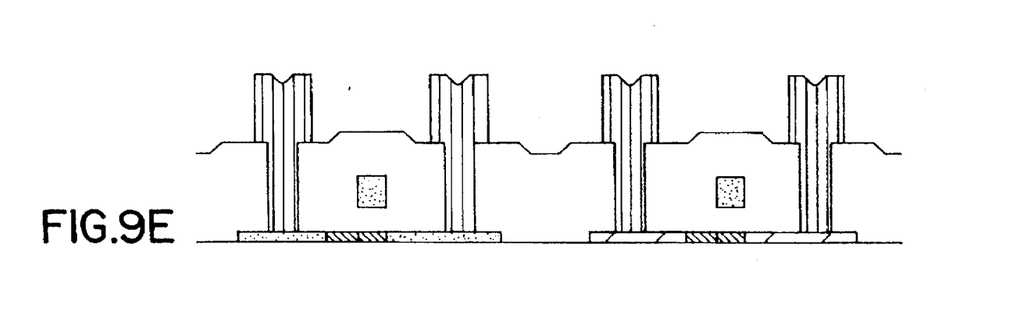

A silicon oxide film 601 is formed as an interlayer insulating film by a plasma CVD as shown in FIG. 9B, and then contact holes are formed as shown in FIG. 9C. Further, after aluminum 602 is formed as an electrode by a sputtering as shown in FIG. 9D, a circuit is constructed by patterning (FIG. 9E).

By the present invention, a MOS transistor having an offset structure or an LDD structure can be manufactured easily without changing the number of processes largely.

What is claimed is:

1. A method for forming a semiconductor device comprising:

forming on a gate electrode a blocking material which has a lower etching rate than that of the gate electrode, and which has a light blocking characteristic or is a smaller refractive index than that of a positive resist;

side-etching the gate electrode;

forming the positive resist and performing oblique exposure from a source region side, to remain the positive resist in only drain region side in a side of the gate electrode; and performing an impurity implantation using the positive resist and the gate electrode as masks, to form an offset region between a drain region and a channel forming region.

2. The method of claim 1 wherein the blocking material overhangs the gate electrode.

3. A method for forming a semiconductor device comprising:

forming on a gate electrode a blocking material which has a lower etching rate than that of the gate electrode, and which has a light blocking characteristic or is a smaller refractive index than that of a positive resist;

side-etching the gate electrode;

forming the positive resist and performing oblique exposure from a source region side, to remain the positive resist in only drain region side in a side of the gate electrode;

performing an impurity implantation using the positive resist and the gate electrode as masks, to form a non-doped region between a drain region and a channel forming region; and removing the positive resist and then performing an impurity implantation, to form a lightly doped region in the non-doped region.

4. The method of claim 3 wherein the lightly doped region has an impurity concentration of $1\times10^{15}$ to $1\times10^{18}$ atoms/cm$^3$.

5. The method of claim 3 wherein the blocking material overhangs the gate electrode.

6. A method for forming a semiconductor device comprising:

forming on a gate electrode a blocking material which has a lower etching rate than that of the gate electrode, and which has a light blocking characteristic or is a smaller refractive index than that of a positive resist;

side-etching the gate electrode;

forming the positive resist and performing oblique exposure from a source region side, to remain the positive resist in only drain region side in a side of the gate electrode;

etching a gate insulating film using the positive resist and the gate electrode as masks, to remain the thicker gate insulating film than that on source and drain regions, under the positive resist; and performing an impurity implantation using the remaining gate insulating film as a mask, to form one of a lightly doped region and a non-doped region.

7. The method of claim 6 wherein the blocking material overhangs the gate electrode.

* * * * *